United States Patent [19]

Dayton

[11] Patent Number: 4,536,665
[45] Date of Patent: Aug. 20, 1985

[54] CIRCUIT FOR CONVERTING TWO BALANCED ECL LEVEL SIGNALS INTO AN INVERTED TTL LEVEL SIGNAL

[75] Inventor: Birney D. Dayton, Nevada City, Calif.

[73] Assignee: The Grass Valley Group, Inc., Grass Valley, Calif.

[21] Appl. No.: 453,032

[22] Filed: Dec. 27, 1982

[51] Int. Cl.³ .............. H03K 19/092; H03K 19/086; H03K 19/003; H03K 3/33

[52] U.S. Cl. .................................. 307/475; 307/443; 307/455

[58] Field of Search ............... 307/443, 455, 467, 475

[56] References Cited

U.S. PATENT DOCUMENTS

| | | | |
|---|---|---|---|
| 3,173,023 | 7/1961 | Talsoe | 307/443 X |
| 3,909,637 | 9/1975 | Dorler | 307/455 X |
| 4,355,245 | 10/1982 | Isogai | 307/443 X |
| 4,359,689 | 11/1982 | Guenthner | 307/455 X |

Primary Examiner—Stanley D. Miller
Assistant Examiner—David R. Bertelson
Attorney, Agent, or Firm—John Smith-Hill

[57] ABSTRACT

A circuit for converting ECL logical signals into TTL logical signals comprises a differential amplifier defining two current paths leading to a negative reference potential source. When the ECL input signal is logical zero, the first current path is closed and the second current path is open, and vice versa when the input signal is logical one. A first transistor has its base connected to the first current path and its emitter connected to a positive reference potential source, and is biased by a load resistor connected to the first current path. A second transistor has its emitter connected to the collector of the first transistor and its base connected to the second current path, and is biased by a second resistor. When the input ECL signal is logical one, the first current path is open and the first and second transistors are on and off respectively, the potential at the output terminal of the circuit being limited by a clamping diode connected between the base and collector of the first transistor. When the input ECL signal is logical zero, the first transistor is non-conductive and the second transistor behaves as an emitter follower, and the potential at the output terminal is close to ground.

12 Claims, 1 Drawing Figure

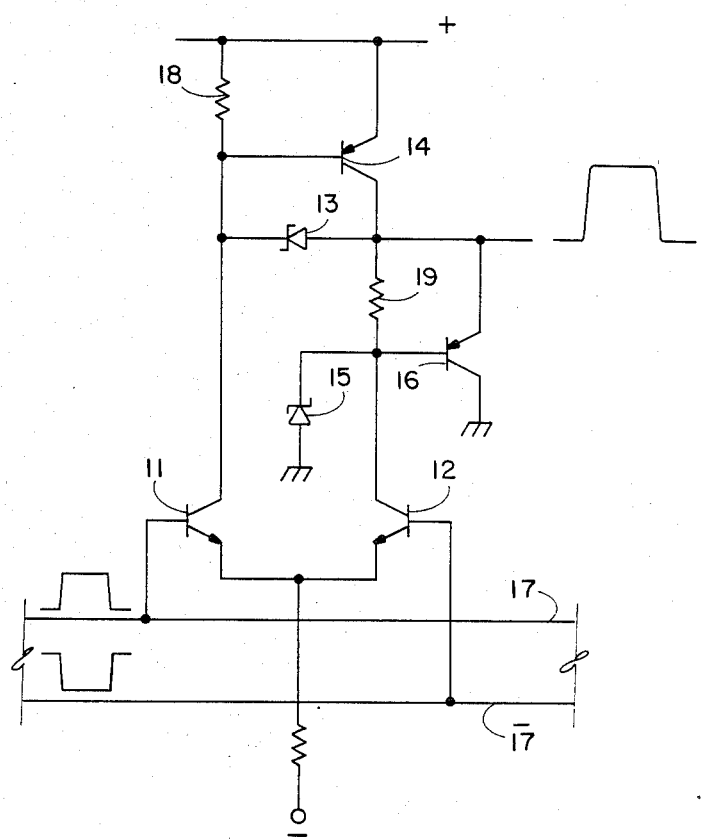

CIRCUIT FOR CONVERTING TWO BALANCED ECL LEVEL SIGNALS INTO AN INVERTED TTL LEVEL SIGNAL

This invention relates to a circuit for converting logical signals of one polarity into a logical signal of the opposite polarity.

BACKGROUND OF INVENTION

Two known digital logic systems are the ECL system and the TTL system. The TTL system operates using a single signal-carrying conductor and with potential levels of 0.8 volts and 2.0 volts (0.8 volts represents logical zero and 2.0 volts represents logical one). In the ECL system complementary signals are carried on two conductors, and potential levels of −1.8 volts on one conductor (the "principal conductor") and −0.65 volts on the other conductor (the "complementary conductor"), represent logical zero whereas logical one is represented by −0.65 volts on the principal conductor and −1.8 volts on the complementary conductor. The ECL system is superior to the TTL system for transmission of signals over long distances, because the ECL system has better noise immunity than the TTL system. On the other hand, many circuit components operating in the TTL system exhibit superior performance to equivalent components which operate in the ECL system. In addition, there are some functions that can be performed using circuit components which operate using TTL voltage levels but cannot be performed satisfactorily using components which operate using ECL voltage levels. For example, high speed (vistate drivers using TTL voltage levels are readily available, but drivers which operate using ECL voltage levels are not readily available.

SUMMARY OF INVENTION

Accordingly, a need exists for a device which is capable of rendering TTL circuit components compatible with an ECL transmission system.

In a preferred embodiment of the invention, the principal and complementary conductors are connected to the bases of two npn transistors forming a current switch, the emitters of the transistors being connected through a resistor to a reference potential level that is more negative than the two ECL levels. The collectors of the two npn transistors are respectively connected to the bases of first and second pnp transistors. The first pnp transistor has its emitter connected to a reference potential level that is more positive than the two TTL levels. A first resistor is connected between the base and emitter of the first pnp transistor, and a first diode is connected between the base and collector of the first pnp transistor. A second resistor is connected between the base of the second pnp transistor and the collector of the first pnp transistor. The collector of the second pnp transistor is connected to a potential level intermediate the less negative of the ECL potential levels and the less positive of the TTL potential levels, and a second diode is connected between the base of the second pnp transistor and a potential level intermediate the less negative of the ECL potential levels and the less positive of the TTL potential levels.

BRIEF DESCRIPTION OF DRAWING

For a better understanding of the invention, and to show how the same may be carried into effect, reference will now be made by way of example, to the accompanying drawings, the single FIGURE of which illustrates schematically a circuit for converting ECL logic signal levels to TTL logic signal levels.

The circuit shown in the drawing comprises a pair of input transistors 11 and 12 having their bases connected to respective conductors 17 and $\overline{17}$ of one line of an ECL data bus and having their emitters connected through a resistor to a negative potential source. The collector of the transistor 11 is connected through a 1K ohm resistor 18 to a positive potential source, and is also connected to the cathode of a Schottky diode 13 and the base of a transistor 14. The collector of the transistor 12 is connected through another 1K ohm resistor 19 to the anode of the diode 13 and the collector of the transistor 14, and is also connected to the cathode of a Schottky diode 15 and to the base of a transistor 16. The collector of the transistor 16 is connected to ground and to the anode of the diode 15, or to a negative potential level, and its emitter is connected to the anode of the diode 13. The output of the circuit is taken from the emitter of the transistor 16.

When the conductor 17 is at −1.8 volts and the conductor $\overline{17}$ is at −0.65 volts, the transistor 11 is off and the transistor 12 is on. The transistor 14 is held off, and the transistor 12 draws current through the resistor 19. The transistor 16 is therefore conductive, and behaves as an emitter follower. The base of the transistor 16 is at a negative voltage, which is limited to a small value by the clamping action of the diode 15, and the emitter of the transistor 16 is just positive.

When the conductor 17 is at −0.65 volts and the conductor $\overline{17}$ is at −1.8 volts, the transistor 11 is on and the transistor 12 is off. The transistors 14 and 16 are on and off respectively. The voltage of the emitter of the transistor 16 is at a positive voltage, limited by the clamping action of the diode 13.

The voltage at the emitter of the transistor 16 exhibits symmetrical transitions in response to square wave logical signals on the conductors 17 and $\overline{17}$. In fact, the transitions closely approximate a $\sin^2$ waveform, and they are free of undershoot on the falling edge. This makes the circuit particularly suitable for driving an MOS memory device, such as a latch.

The illustrated circuit exhibits high speed operation yet consumes very little power when in either stable state: significant power is consumed only in the switching operation. These advantages flow from the use of bipolar transistors. The present state of the field-effect transistor art is not sufficiently advanced to provide an integrated circuit having sufficiently rapid operation without an unacceptable level of power consumption.

It will be appreciated that the invention is not restricted to the particular circuit which has been described and illustrated, since variations may be made therein without departing from the scope of the invention as defined in the appended claims, and equivalents thereof.

I claim:

1. A circuit for receiving, at first and second input terminals respectively, a first input logical signal having one of two possible negative potential levels, relative to a ground reference potential level, and a second input logical signal having the other of the two possible negative potential levels, and converting said input logical signals into a logical output signal, having one of two possible positive potential levels, at an output terminal, said circuit comprising:

a switch device defining two current paths which are connectable to a reference potential level that is more negative than either of said two possible negative potential levels, said switch device having a first condition, in which one current path is open and the other is closed, and a second condition, in which said one current path is closed and said other path is open, and being in said first condition when the first input terminal is at the more negative of said two possible negative potential levels and in said second condition when the second input terminal is at the more negative of said two possible negative potential levels;

a first transistor having its base connected to said one current path, the emitter of said first transistor being connectable to a reference potential level that is more positive than either of said two possible positive potential levels;

a first resistor connected between the base and the emitter of said first transistor;

a first diode connected between the base and the collector of said first transistor;

a second transistor having its base connected to said other current path and its emitter connected to said output terminal and to the collector of said first transistor, the collector of said second transistor being connectable to a reference potential level intermediate the less negative of the two possible negative potential levels and the less positive of the two possible positive potential levels;

a second resistor connected between the base of said second transistor and the collector of said first transistor; and a second diode having one terminal connected to the base of said second transistor and having its other terminal connectable to a reference potential level intermediate the less negative of the two possible negative potentials levels and the less positive of the two possible positive potential levels.

2. A circuit according to claim 1, wherein said diodes are variable capacitance diodes.

3. A circuit according to claim 1, wherein said diodes are Schottky barrier diodes.

4. A circuit according to claim 1, wherein said switch device comprises a pair of transistors providing the two current paths respectively, one transistor of the pair having its base connected to said first input terminal and its collector connected to the base of said first transistor, and the other transistor of the pair having its base connected to said second input terminal and its collector connected to the base of said second transistor, the emitters of the pair of transistors being connected to one end of a third resistor which is connectable at its other end to the negative reference potential level.

5. A circuit according to claim 1, wherein the collector of the second transistor is connected to said other terminal of the second diode.

6. A circuit for receiving, at first and second input terminals respectively, a first input logical input signal having one of two possible potential levels of one polarity and a second input logical signal having the other of the two possible potential levels of said one polarity, and converting said input logical signals into a logical output signal, having one of two possible potential levels of the opposite polarity, at an output terminal, said circuit comprising:

a switch device defining two current paths which are connectable to a reference potential level of said one polarity and having a greater absolute value than either of said two possible potential levels of said one polarity, said switch device having a first condition, in which one current path is open and the other is closed, and a second condition, in which one current path is closed and said other path is open, and being in said first condition when the first input terminal is at that possible potential level of said one polarity which has the greater absolute value and in said second condition when the second input terminal is at that possible potential level of said one polarity which has the greater absolute value;

a first transistor having its base connected to said one current path and its collector connected to said output terminal, the emitter of said first transistor being connectable to a reference potential level of said opposite polarity and having an absolute value greater than the absolute value of either of said two possible potential levels of said opposite polarity;

a first resistor connected between the base and the emitter of said first transistor;

a first diode connected between the base and the collector of said first transistor;

a second transistor having its base connected to said other current path and its emitter connected to said output terminal and to the collector of the first transistor, the collector of the second transistor being connectable to a reference potential level intermediate that one of the two possible potential levels of said one polarity which has the lesser absolute value and that one of said two possible potential levels of the opposite polarity which has the lesser absolute value;

a second resistor connected between the base of said second transistor and the collector of said first transistor; and a second diode having one terminal connected to the base of said second transistor having its other terminal connectable to a reference potential level intermediate said one potential level of said one polarity and said one potential level of said opposite polarity.

7. A circuit according to claim 6, wherein said first and second transistors are PNP transistors.

8. A circuit according to claim 6, wherein said diodes are variable capacitance diodes.

9. A circuit according to claim 6, wherein said diodes are Schottky barrier diodes.

10. A circuit according to claim 6, wherein said switch device comprises a pair of transistors providing the two current paths respectively, one transistor of the pair having its base connected to said first input terminal and having its collector connected to the base of said first transistor, and the other transistor of the pair having its base connected to said second input terminal and its collector connected to the base of said second transistor, the emitters of the pair of transistors being connected to one end of a third resistor which is connectable at its other end to the reference potential level of said one polarity.

11. A circuit according to claim 10, wherein said one polarity is negative relative to a ground potential level and said opposite polarity is positive relative to said ground potential level, and wherein said first and second transistors are PNP transistors and the transistors of said pair are NPN transistors.

12. A circuit according to claim 5, wherein said second diode is connected between the collector and the base of said second transistor.

* * * * *